United States Patent
Bao et al.

(10) Patent No.: US 11,404,373 B2
(45) Date of Patent: Aug. 2, 2022

(54) HYBRID LOW RESISTANCE METAL LINES

(71) Applicant: QUALCOMM Incorporated, San Diego, CA (US)

(72) Inventors: Junjing Bao, San Diego, CA (US); John Jianhong Zhu, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 265 days.

(21) Appl. No.: 16/702,335

(22) Filed: Dec. 3, 2019

(65) Prior Publication Data
US 2021/0167006 A1     Jun. 3, 2021

(51) Int. Cl.
*H01L 23/528* (2006.01)
*H01L 21/768* (2006.01)
*H01L 23/532* (2006.01)

(52) U.S. Cl.
CPC ........ *H01L 23/528* (2013.01); *H01L 21/7684* (2013.01); *H01L 21/76841* (2013.01); *H01L 23/53238* (2013.01)

(58) Field of Classification Search
CPC ............. H01L 23/528; H01L 21/7684; H01L 21/76841; H01L 23/53238
See application file for complete search history.

(56) References Cited

U.S. PATENT DOCUMENTS

| | | | |
|---|---|---|---|
| 9,502,350 B1 | 11/2016 | Bonilla et al. | |
| 9,793,206 B1 | 10/2017 | Briggs et al. | |
| 2005/0161817 A1* | 7/2005 | Meyer | H01L 21/76846 257/751 |
| 2005/0239285 A1* | 10/2005 | Lien | H01L 21/76813 438/637 |
| 2013/0043556 A1 | 2/2013 | Horak et al. | |
| 2013/0328210 A1* | 12/2013 | Shim | H01L 23/49827 257/774 |
| 2014/0252629 A1 | 9/2014 | Chang et al. | |
| 2018/0174894 A1 | 6/2018 | Bouche et al. | |
| 2019/0205496 A1 | 7/2019 | Li et al. | |
| 2020/0027840 A1* | 1/2020 | Briggs | H01L 21/4853 |

OTHER PUBLICATIONS

Co-Pending U.S. Appl. No. 16/146,843, filed Sep. 28, 2018.
Gall D., "Metals for Low-Resistivity Interconnects", 2018 IEEE International Interconnect Technology Conference (IITC), IEEE, 2018, pp. 157-159.
Wan D., et al., "Subtractive Etch of Ruthenium for Sub-5nm Interconnect", 2018 IEEE International Interconnect Technology Conference (IITC), IEEE, 2018, pp. 10-12.
International Search Report and Written Opinion—PCT/US2020/057701—ISA/EPO—dated Feb. 16, 2021.

* cited by examiner

*Primary Examiner* — Robert G Bachner
(74) *Attorney, Agent, or Firm* — Muncy, Geissler, Olds & Lowe, P.C./Qualcomm

(57) ABSTRACT

Disclosed are standard cells and methods for fabricating standard cells used in semiconductor device design and fabrication. Aspects disclosed include a standard cell having a plurality of wide metal lines. The wide metal lines being formed from copper. The standard cell also includes a plurality of narrow metal lines. The narrow metal lines are formed from a material that has a lower resistance than copper for line widths on the order of twelve nanometers or less.

30 Claims, 10 Drawing Sheets

US 11,404,373 B2

HYBRID LOW RESISTANCE METAL LINES

FIELD OF DISCLOSURE

The present disclosure is related to a standard cell in semiconductor design and in further aspects to hybrid low resistance metal lines implemented in the standard cell.

BACKGROUND

Integrated circuit technology has achieved great strides in advancing computing power through miniaturization of active components. In semiconductor design, standard cells are used in approximately seventy percent of digital designs. Standard cells have allowed for designers to produce complex multi-million gate system on chip (SoC) devices. A standard cell is a group of transistor and interconnect structures that can be used for various logic and storage functions. The standard cell includes narrow and wide metal lines. Narrow lines are used for inner cell routing while wide lines are used for power rail to apply system voltage, supply high current loads, etc.

It is desirable to have low resistance (R) in the power rail to reduce IR drop and low R in narrow line to reduce circuit delay. Copper (CU) dual damascene has been used in conventional designs. However when the cell dimension shrinks (e.g. 30% in every node), Cu resistivity increases rapidly due to surface scattering.

As semiconductor designs scale down and have critical dimensions of twelve nanometers (nm) or smaller, it is desired to have both low resistance in the wide metal lines (e.g., power rails) and also low resistance in the narrow metal lines (e.g., signal lines).

SUMMARY

The following summary identifies some features and is not intended to be an exclusive or exhaustive description of the disclosed subject matter. Additional features and further details are found in the detailed description and appended claims. Inclusion in the Summary is not reflective of importance. Additional aspects will become apparent to persons skilled in the art upon reading the following detailed description and viewing the drawings that form a part thereof.

Aspects disclosed include a standard cell having a plurality of wide metal lines. The wide metal lines being formed from copper. The standard cell also includes a plurality of narrow metal lines. The narrow metal lines are formed from a material that has a lower resistance than copper for line widths on the order of twelve nanometers or less.

Other aspect disclosed include a method for fabricating a standard cell. A plurality of wide metal lines are fabricated. The wide metal lines being formed from copper. A plurality of narrow metal lines are also fabricated. The narrow metal lines are formed from a material that has a lower resistance than copper for line widths on the order of twelve nanometers or less.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of embodiments of the present disclosure and are provided solely for illustration of the various aspects disclosed and not limitation thereof.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As discussed in the foregoing, there is a need to reduce the resistance in both narrow metal lines and wide metal lines in standard cells for semiconductors. In one example, copper is used for the wide metal lines and other materials are used for the narrow metal lines.

Figure 1A:
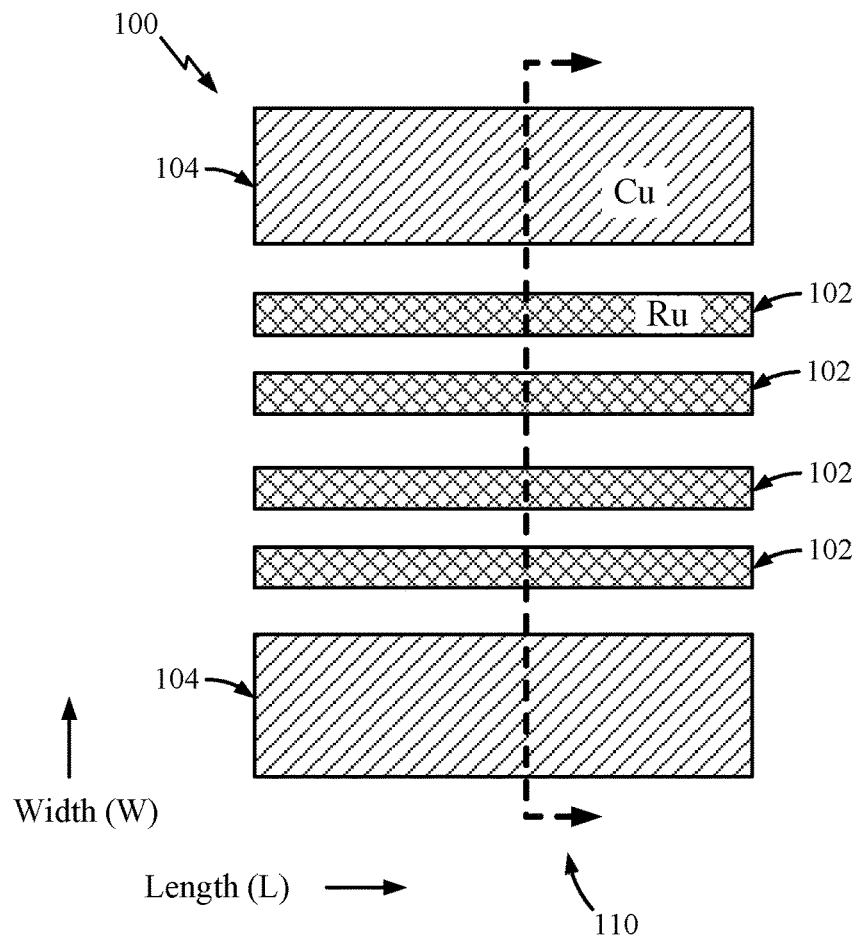
FIG. 1A is an illustration depicting aspects of a standard cell according to aspects of the disclosure.

FIG. 1A is an illustration depicting aspects of a standard cell 100 according to aspects of the disclosure. As illustrated, the standard cell 100 may include a plurality of wide metal lines 104 (e.g., power rails). The wide metal lines 104 may be formed from copper (CU). Additionally, the standard cell 100 may include a plurality of narrow metal lines 102 (e.g., signal lines). The plurality of narrow metal lines 102 may be formed of Ruthenium (Ru), as illustrated. However, as discussed in the following, it will be appreciated that other materials may be used. Additionally, as illustrated, the standard cell 100, may have two or more wide metal lines 104 disposed on opposite sides of the plurality of narrow metal lines 102. In some aspects, a ratio of a width (W) of the wide metal lines 104 and the narrow metal lines 102 is on the order of three to one.

It will be appreciated that the arrangement of the plurality of narrow metal lines 102 and the plurality of wide metal lines 104 in FIG. 1A is provided for illustrative purposes only. There are any number of arrangements of narrow metal lines 102 and wide metal lines 104 that can be used to form a standard cell, including variations in the number and location of the plurality of narrow metal lines 102 and/or the plurality of wide metal lines 104. Additionally, it will be appreciated that these illustrations are provided solely to aid in explanation and for illustration of the various aspects disclosed and not limitation thereof. Further, as illustrated, a cross-sectional portion 110 is indicated by a reference line and will be discussed in greater detail in the following.

Figure 1B:
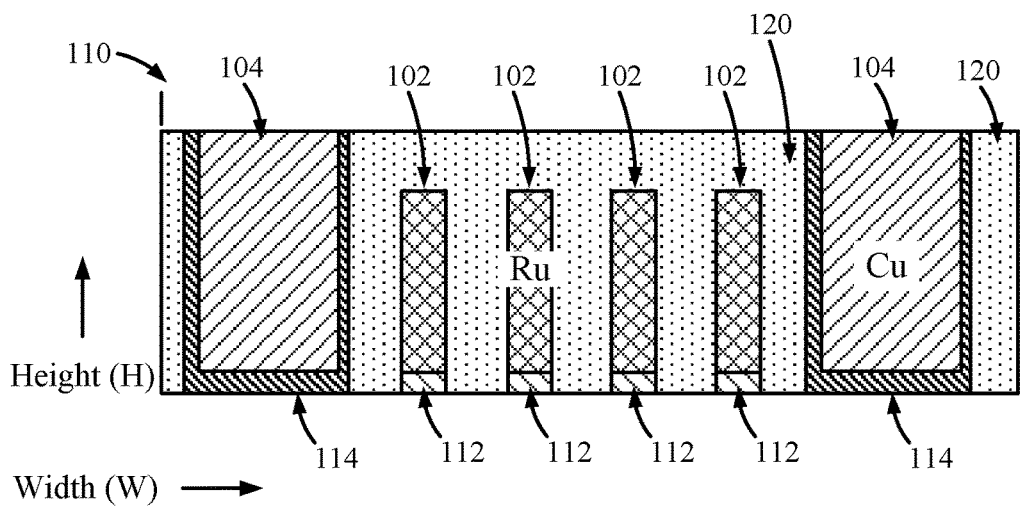
FIG. 1B is an illustration depicting a cross-sectional portion of the standard cell of FIG. 1A according to aspects of the disclosure.

FIG. 1B is an illustration depicting a cross-sectional portion 110 of the standard cell of FIG. 1A according to aspects of the disclosure. As illustrated in the cross-sectional view, the narrow metal lines 102 have a lower profile than the wide metal lines 104. For example, the wide metal lines 104 may have a height (H) that extends 5 nm or more beyond the narrow metal lines 102. Additionally, the narrow metal lines 102 have an adhesion layer 112 which may be formed of titanium nitride (TiN). The wide metal lines 104 may have a barrier 114 surrounding the copper of the wide metal lines. The barrier 114 may be formed of tantalum nitride (TaN) combinations such as TaN/Ta, TaN/Co (cobalt), TaN/Ru, and the like. The barrier 114 separates the wide metal line 104 from the dielectric 120 to prevent migration of the copper into the dielectric 120. The narrow metal lines 102 do not have a barrier. The dielectric 120 can be formed of a low dielectric constant material (low k material) such as carbon doped oxide dielectrics comprised of Si, C, O, and H (SiCOH) films or carbon doped oxide, (CDO).

Figure 2:
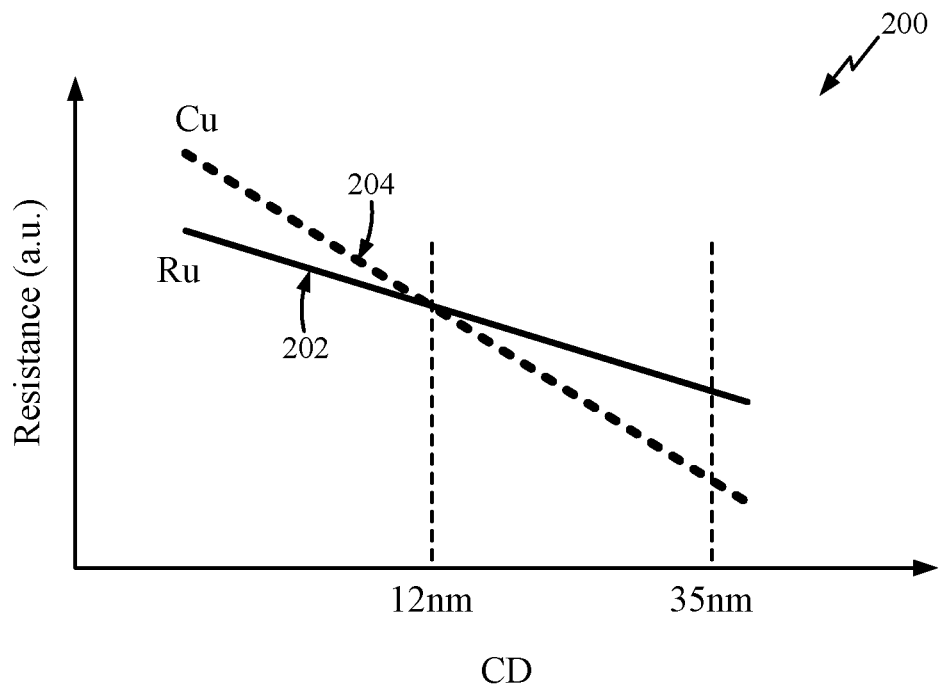
FIG. 2 is an illustration depicting a resistance vs. line width curve according to aspects of the disclosure.

FIG. 2 is an illustration of a graph 200 illustrating resistance versus a critical dimension for copper (Cu) and ruthenium (Ru). In this example illustration, it can be seen from the Ru line 202 that Ru has a lower resistance than Cu as illustrated by the Cu line 204 below a certain critical dimension (CD), e.g., the narrow line width. In this example, the CD is a line width of 12 nm. Also, it can be seen from the graph 200 that Cu above a narrow line width (e.g., in the range of 12 nm) has a lower resistance than Ru and the difference increases as the Ru line 202 and Cu line 204 approach another CD for wide metal lines (e.g., in the range of 35 nm).

It will be appreciated that the foregoing materials, arrangement and critical dimensions provided for the narrow metal lines 102 and provided for the wide metal lines 104 are provided for illustrative purposes only. For example, the narrow metal line material has been discussed as being Ru. However, it will be appreciated that other materials may be used. For example, the plurality of narrow metal lines 102 may be formed from at least one of the group consisting of rhodium (Rh), Platinum (Pt), iridium (Ir), Niobium (Nb), Nickel (Ni), Aluminum (Al), Ruthenium (Ru), Molybdenum (Mo) and Osmium (Os). For convenience of providing fabrication examples and further explanation of the various aspects disclosed herein, Ru will be used for the narrow lines. However, it will be appreciated that these illustrations and materials provided herein are provided solely to aid in explanation and for illustration of the various aspects disclosed and not limitation thereof.

The following description of an example fabrication process is provided for illustration of the various aspects disclosed herein. It is intended to provide an example for illustration purposes and not to serve as a detailed description of every aspect of fabrication and/or alternative fabrication processes. Conventional and well know processes may be left out and/or not detailed, as it is unnecessary to inform one skilled in the art. Likewise, alternative fabrication techniques will be appreciated by those skilled in the art and will not necessarily be detailed for each aspect.

Figure 3:
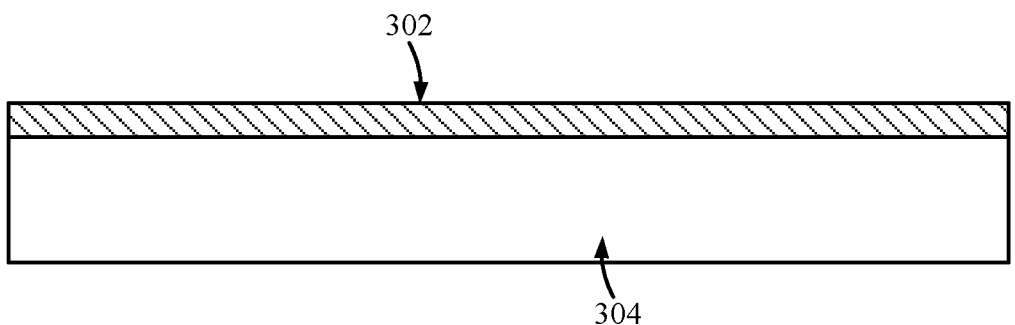
FIG. 3 is an illustration of a portion of a fabrication process according to aspects of the disclosure.

FIG. 3 is an illustration of a portion of a fabrication process according to aspects of the disclosure. As illustrated in FIG. 3, an adhesion layer 302 is deposited on a substrate 304. The adhesion layer 302 may have a thickness in the rage of 0.3 nm to 1 nm. Additionally, the adhesion layer 302 may be formed of titanium nitride (TiN). For brevity and convenience of illustration, the substrate 304 will not be illustrated in the remaining discussion.

Figure 4:
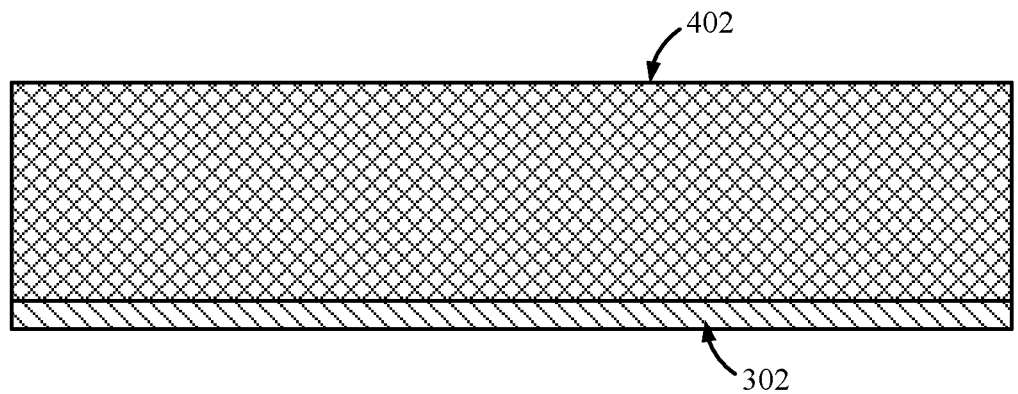
FIG. 4 is an illustration of a portion of a fabrication process according to aspects of the disclosure.

FIG. 4 is an illustration of a further portion of a fabrication process according to aspects of the disclosure. As illustrated in FIG. 4, the narrow metal line material 402 use to form the narrow metal lines (e.g., 102) is deposited on the adhesion layer 302. The narrow line material 402 may be deposited using chemical vapor deposition (CVD), which is a vacuum deposition method used to produce thin films. The narrow metal line material 402 may be formed from Ru. However, it will be appreciated that other materials may be used, as discussed above.

Figure 5:
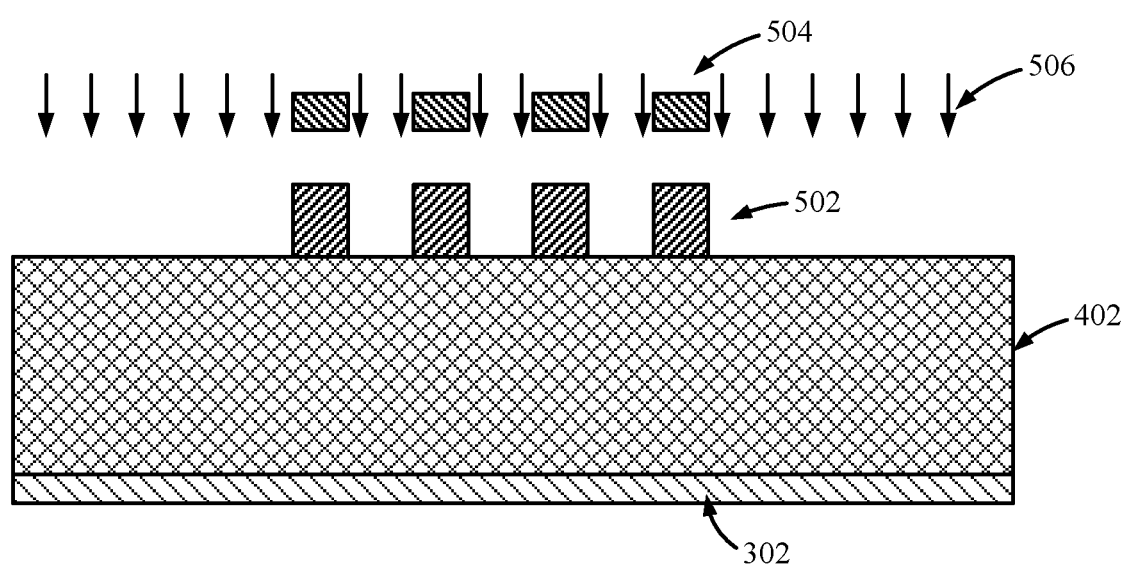
FIG. 5 is an illustration of a portion of a fabrication process according to aspects of the disclosure.

FIG. 5 is an illustration of a further portion of a fabrication process according to aspects of the disclosure. As illustrated in FIG. 5, a photoresist (PR) is deposited (not illustrated) and is patterned using mask 504 and ultraviolet (UV) radiation 506. The photo resist is then etched (not illustrated) resulting in the patterned photoresist (PR) 502. The various process operations have been combined in this illustration for simplicity and it will be appreciated that other techniques and/or additional processes may be used to form the patterned PR 502.

Figure 6:
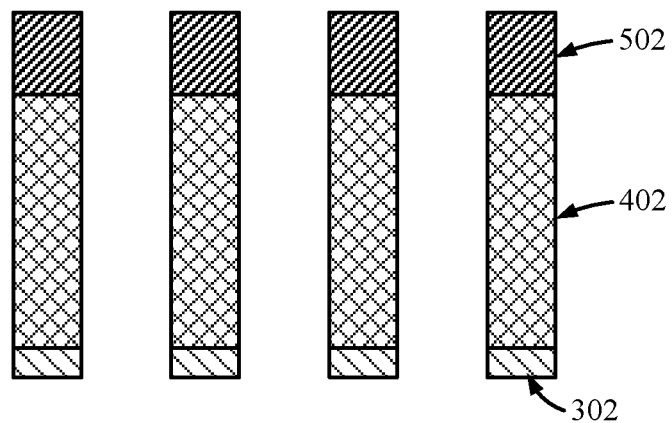
FIG. 6 is an illustration of a portion of a fabrication process according to aspects of the disclosure.

FIG. 6 is an illustration of a further portion of a fabrication process according to aspects of the disclosure. As illustrated in FIG. 6, the patterned PR 502 is used to protect portions of the adhesion layer 302 and narrow metal line material 402 during a plasma etching process. In this example, a chlorine plasma etching process can be used to form the resulting structure of FIG. 6, where the portions of the adhesion layer 302 and narrow metal line material 402 not protected by the patterned PR 502 are removed. The patterned and etched portions of narrow metal line material 402, may also be referred to herein as narrow metal lines 402, which are similar to the narrow metal lines 102 illustrated in FIGS. 1A and 1B.

Figure 7:
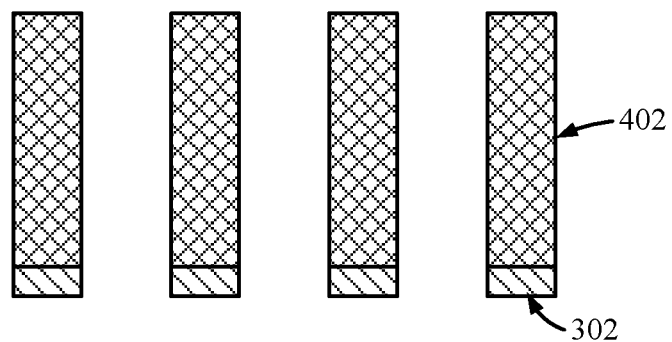
FIG. 7 is an illustration of a portion of a fabrication process according to aspects of the disclosure.

FIG. 7 is an illustration of a further portion of a fabrication process according to aspects of the disclosure. As illustrated in FIG. 7, the photoresist is removed leaving the patterned portions of adhesion layer 302 and the narrow metal line material 402, forming the narrow metal lines (e.g., 102, as discussed above). The photoresist may be removed by a process such as plasma oxygen ashing.

Figure 8:
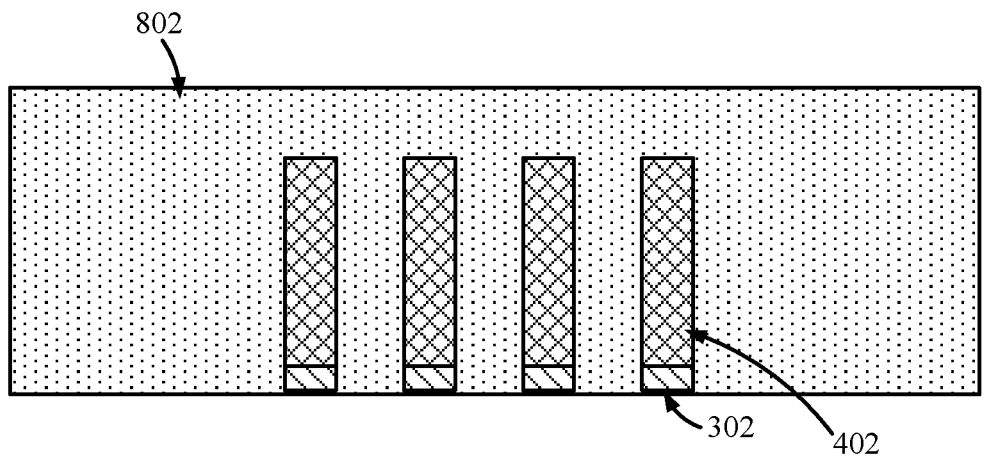
FIG. 8 is an illustration of a portion of a fabrication process according to aspects of the disclosure.

FIG. 8 is an illustration of a further portion of a fabrication process according to aspects of the disclosure. As illustrated in FIG. 8, a flowable chemical vapor deposition (CVD) of a low dielectric constant material (low k material) 802 such as SiCOH, CDO, etc. is formed.

Figure 9:
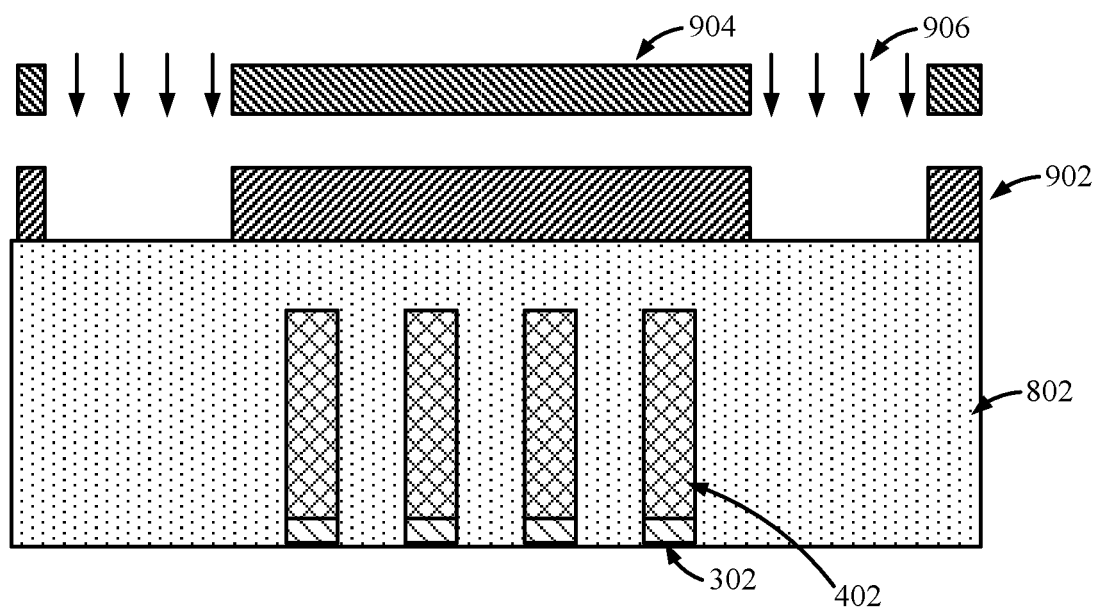
FIG. 9 is an illustration of a portion of a fabrication process according to aspects of the disclosure.

FIG. 9 is an illustration of a further portion of a fabrication process according to aspects of the disclosure. As illustrated in FIG. 9, a photoresist (PR) is deposited (not illustrated) and is patterned using mask 904 and ultraviolet (UV) radiation 906. The photo resist is then etched (not illustrated) resulting in the patterned photoresist (PR) 902. The various process operations have been combined in this illustration for simplicity and it will be appreciated that other techniques and/or additional processes may be used to form the patterned PR 902. The patterned PR 902 is used to protect portions of the dielectric 802 and previously patterned portions of the adhesion layer 302 and the narrow metal line material 402.

Figure 10:
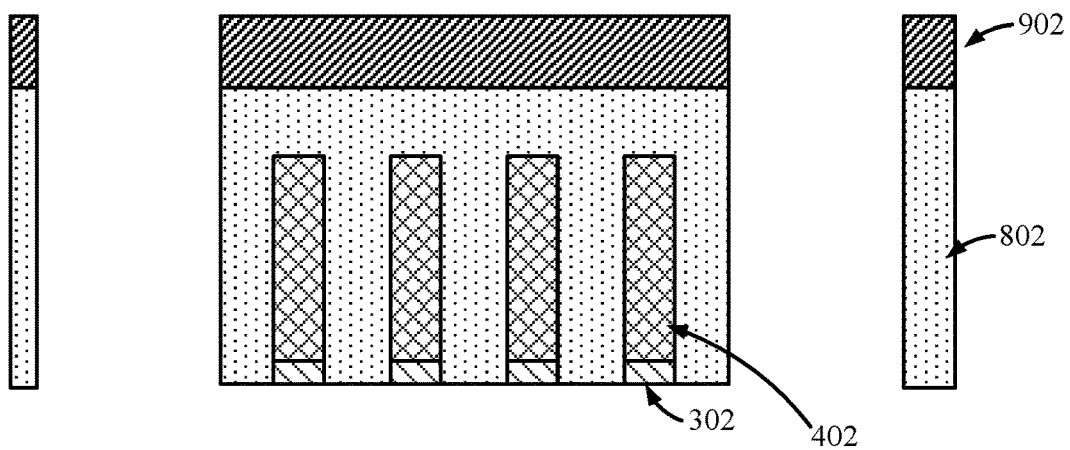
FIG. 10 is an illustration of a portion of a fabrication process according to aspects of the disclosure.

FIG. 10 is an illustration of a further portion of a fabrication process according to aspects of the disclosure. As illustrated in FIG. 10, the patterned PR 902 is used to protect portions of the dielectric 802 and the previously patterned portions of the adhesion layer 302 and narrow metal line material 402 during a plasma etching process. In this example, a fluorine plasma etching process can be used to form the resulting structure of FIG. 10, where the portions of the dielectric 802 are removed.

Figure 11:
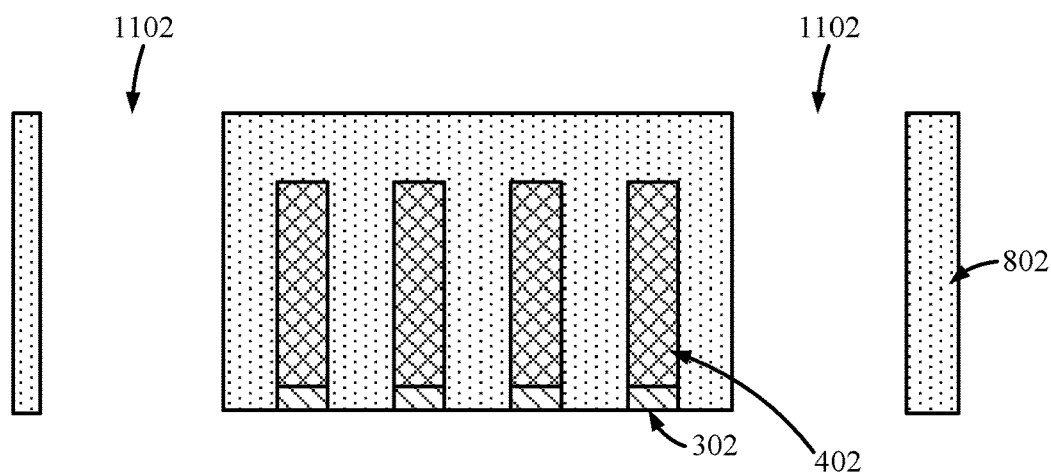
FIG. 11 is an illustration of a portion of a fabrication process according to aspects of the disclosure.

FIG. 11 is an illustration of a further portion of a fabrication process according to aspects of the disclosure. As illustrated in FIG. 11, the photoresist is removed leaving the patterned portions of dielectric 802, the adhesion layer 302 and the narrow metal line material 402 (e.g., the narrow metal lines 102, as discussed above) and channels 1102 for the wide metal lines. The photoresist may be removed by a process such as plasma oxygen ashing.

Figure 12:
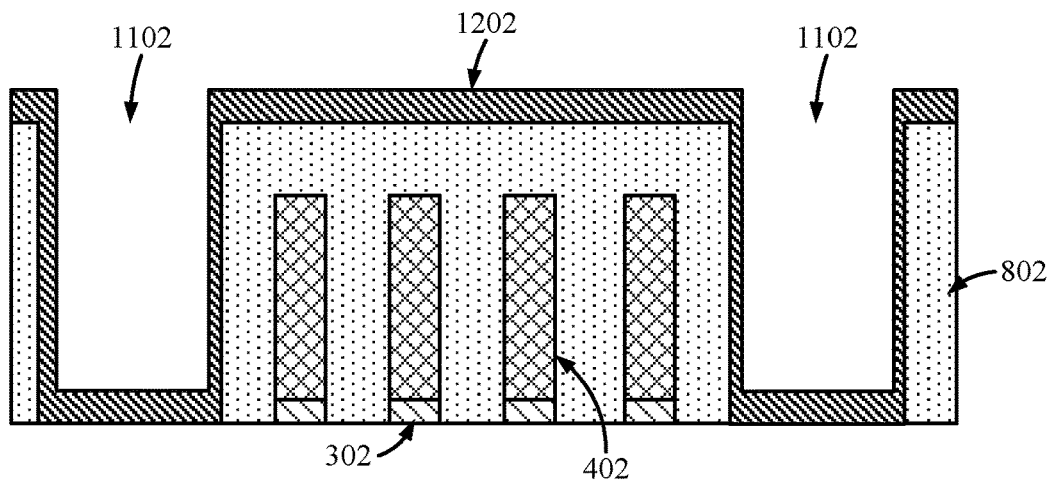
FIG. 12 is an illustration of a portion of a fabrication process according to aspects of the disclosure.

FIG. 12 is an illustration of a further portion of a fabrication process according to aspects of the disclosure. As illustrated in FIG. 12, a barrier 1202 is disposed over the patterned portions of dielectric 802, the adhesion layer 302 and the narrow metal line material 402 and in the channels 1102 for the wide metal lines. The barrier may be formed of at least one of tantalum nitride (TaN) combinations including at least one of TaN/Ta, TaN/Co or TaN/Ru. Each layer of the combination may be deposited using physical vapor deposition (PVD), chemical vapor deposition (CVD) or atomic layer deposition (ALD), which includes various vacuum deposition methods that can be used to produce thin films and coatings. Common PVD methods include sputtering and evaporation. Accordingly, in one part of the process, TaN can be deposited and then in another part of the process Ta, Co or Ru can be deposited forming the barrier 1202 of a at least one of the TaN combinations.

Figure 13:
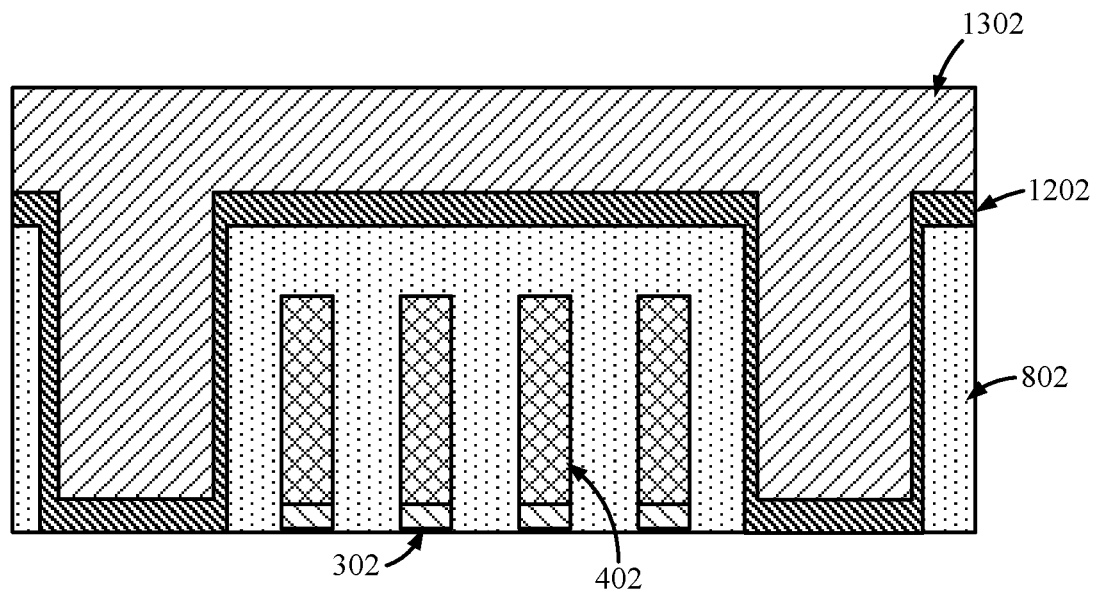
FIG. 13 is an illustration of a portion of a fabrication process according to aspects of the disclosure.

FIG. 13 is an illustration of a further portion of a fabrication process according to aspects of the disclosure. As illustrated in FIG. 13, copper 1302 is deposited over barrier 1202 and consequently over the patterned portions of dielectric 802, the adhesion layer 302 and the narrow metal line material 402 and fills in the channels for forming the wide metal lines. The copper may be deposited using an electrochemical deposition process, such as depositing a seed layer and then electroplating the copper fill as part of a damascene process.

Figure 14:
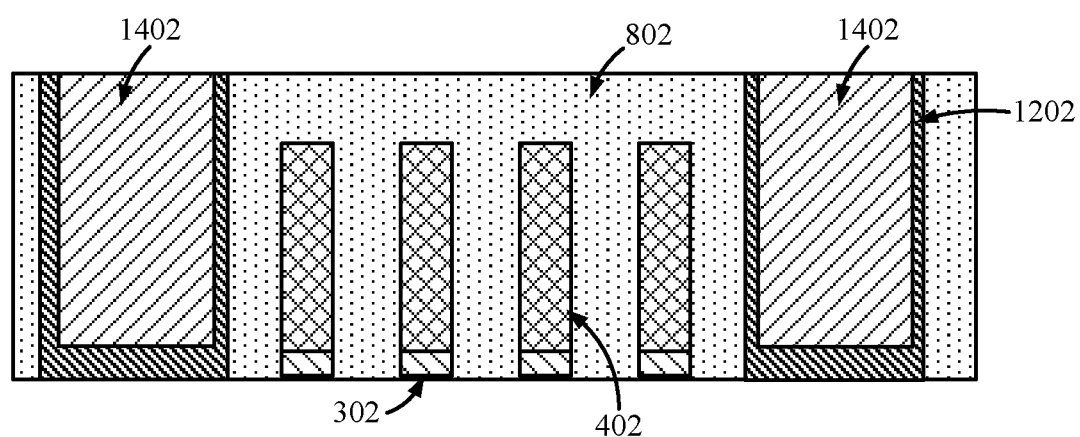
FIG. 14 is an illustration of a portion of a fabrication process according to aspects of the disclosure.

FIG. 14 is an illustration of a further portion of a fabrication process according to aspects of the disclosure. As illustrated in FIG. 14, excess copper is removed along with portions of the barrier and the surface is planarized using chemical mechanical polishing/planarization (CMP) as part of the damascene process. CMP is a process that removes materials by a combination of chemical and mechanical (or abrasive) actions to achieve highly smooth and planar material surfaces. With the excess copper and barrier portions removed, the wide metal lines 1402 are formed and are isolated from the dielectric 802 by the barrier 1202. Consequently, the excess copper and barrier portions are also removed from the patterned portions of the adhesion layer 302 and the narrow metal line material 402. The narrow metal lines 402 are covered by the dielectric 802 and are not exposed to the CMP process, as they have a smaller height than the wide metal lines 1402.

The resulting standard cell of FIG. 14 is similar to that illustrated in FIGS. 1A and 1B. Accordingly, it will be appreciated that aspects of the disclosure include a standard cell having a plurality of wide metal lines (e.g., 104, 1402). The wide metal lines are formed from copper. Additionally, the standard cell a plurality of narrow metal lines (e.g., 102, 402). The narrow metal lines are formed from a material that has a lower resistance than copper for line widths on the order of twelve nanometers or less. Additionally, it will be appreciated that because of the height difference of the wide metal lines (e.g., 104, 1402) and the narrow metal lines (e.g., 102, 402), the narrow metal lines are not exposed the CMP process. It will be appreciated that it is extremely difficult to perform a CMP process on Ru. Accordingly, the height difference provides an improvement in the processing of the standard cell containing Cu wide metal lines and Ru narrow metal lines. It will also be appreciated from the foregoing description that the narrow metal lines are formed by subtractive etching, while the wide metal lines are formed by a damascene process. The standard cells according to aspects disclosed herein may be used for the back end of line (BEOL) portion of integrated circuit fabrication for interconnecting individual devices (e.g., transistors, capacitors, resistors, inductors, etc.) forming contacts and bonding sites for die-to-package or package to package connections. Accordingly, any of the various circuits and/or components described below in relation to the exemplary mobile device or other apparatuses may include devices utilizing the various aspects disclosed herein.

Figure 15:
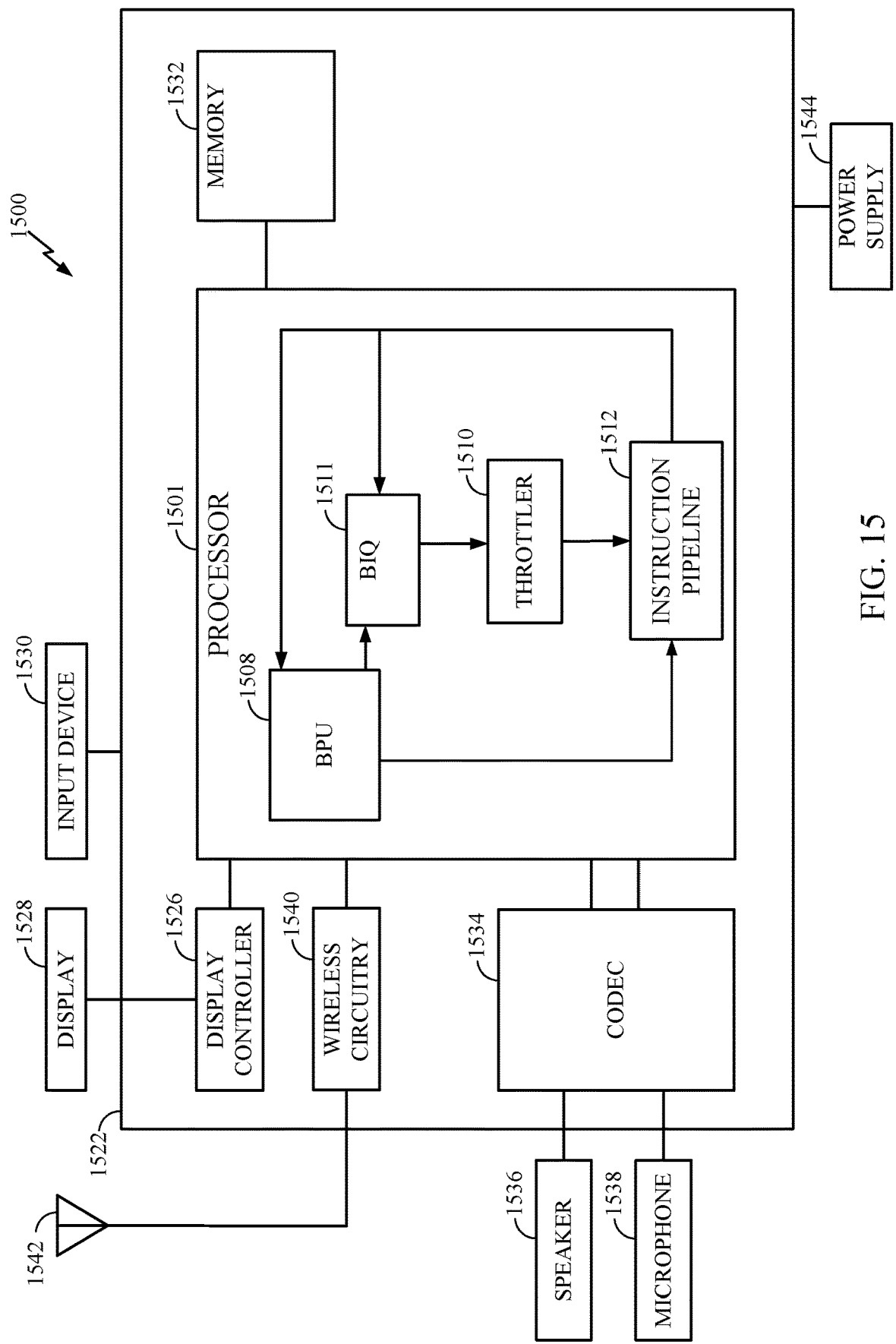
FIG. 15 is an illustration of a mobile device according to aspects of the disclosure.

FIG. 15 illustrates an exemplary mobile device in accordance with some aspects of the disclosure. Referring now to FIG. 15, a block diagram of a mobile device that is configured according to exemplary aspects is depicted and generally designated as mobile device 1500. In some aspects, mobile device 1500 may be configured as a wireless communication device, which may be designed and fabricated in part using standard cells described herein in some aspects. As shown, mobile device 1500 includes processor 1501. Processor 1501 is shown to comprise instruction pipeline 1512, buffer processing unit (BPU) 1508, branch instruction queue (BIQ) 1511, and throttler 1510 as is well known in the art. Other well-known details (e.g., counters, entries, confidence fields, weighted sum, comparator, etc.) of these blocks have been omitted from this view of processor 1501 for the sake of clarity, but may be designed and fabricated, at least in part, using the standard cells disclosed herein.

Processor 1501 may be communicatively coupled to memory 1532 over a link, which may be a die-to-die or chip-to-chip link. Mobile device 1500 also include display 1528 and display controller 1526, with display controller 1526 coupled to processor 1501 and to display 1528.

In some aspects, FIG. 15 may include coder/decoder (CODEC) 1534 (e.g., an audio and/or voice CODEC) coupled to processor 1501; speaker 1536 and microphone 1538 coupled to CODEC 1534; and wireless circuitry 1540 (which may include a modem which may be designed and fabricated, at least in part, using the standard cells disclosed herein) coupled to wireless antenna 1542 and to processor 1501.

In a particular aspect, where one or more of the above-mentioned blocks are present, processor 1501, display controller 1526, memory 1032, CODEC 1534, and wireless circuitry 1540 can be included in a system-in-package or system-on-chip device 1522. Input device 1530 (e.g., physical or virtual keyboard), power supply 1544 (e.g., battery), display 1528, input device 1530, speaker 1536, microphone 1538, wireless antenna 1542, and power supply 1544 may be external to system-on-chip device 1522 and may be coupled to a component of system-on-chip device 1522, such as an interface or a controller.

It should be noted that although FIG. 15 depicts a mobile device, processor 1501 and memory 1532 and various support circuitry including aspects disclosed herein may also be integrated into a set top box, a music player, a video player, an entertainment unit, a navigation device, a personal digital assistant (PDA), a fixed location data unit, a computer, a laptop, a tablet, a communications device, a mobile phone, a wearable device, an Internet of things (IoT) device, a server, a device in an automotive vehicle or other similar devices.

Figure 16:
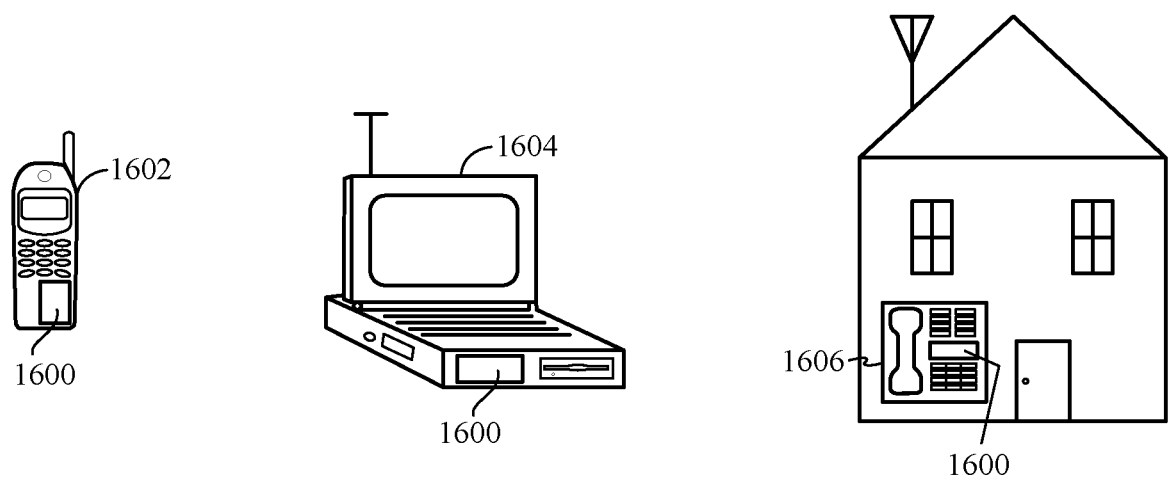
FIG. 16 is an illustration depicting an exemplary communication system according to aspects of the disclosure.

FIG. 16 illustrates various electronic devices which may be designed and fabricated, at least in part, using standard cells according to various aspects disclosed herein. The various device and may include a semiconductor device, integrated circuit, die, package or package-on-package (PoP) and which may be designed and fabricated, at least in part, using standard cells in accordance with some examples of the disclosure. For example, a mobile phone device 1602, a laptop computer device 1604, and a fixed location terminal device 1606 may include a semiconductor device 1600 formed at least in part using standard cells, as described herein. The semiconductor device 1600 may be, for example, any of the integrated circuits, dies, integrated device packages, integrated circuit devices, device packages, integrated circuit (IC) packages, package-on-package devices described herein. The devices 1602, 1604, 1606 illustrated in FIG. 16 are merely exemplary. Other electronic devices may also feature the semiconductor device 1600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device, or any other device that uses digital logic, stores or retrieves data or computer instructions, or any combination thereof.

In order to fully illustrate aspects of the design of the present disclosure, methods of fabrication are presented. Other methods of fabrication are possible, and the method of fabrication is presented only to aid understanding of the concepts disclosed herein.

Figure 17:
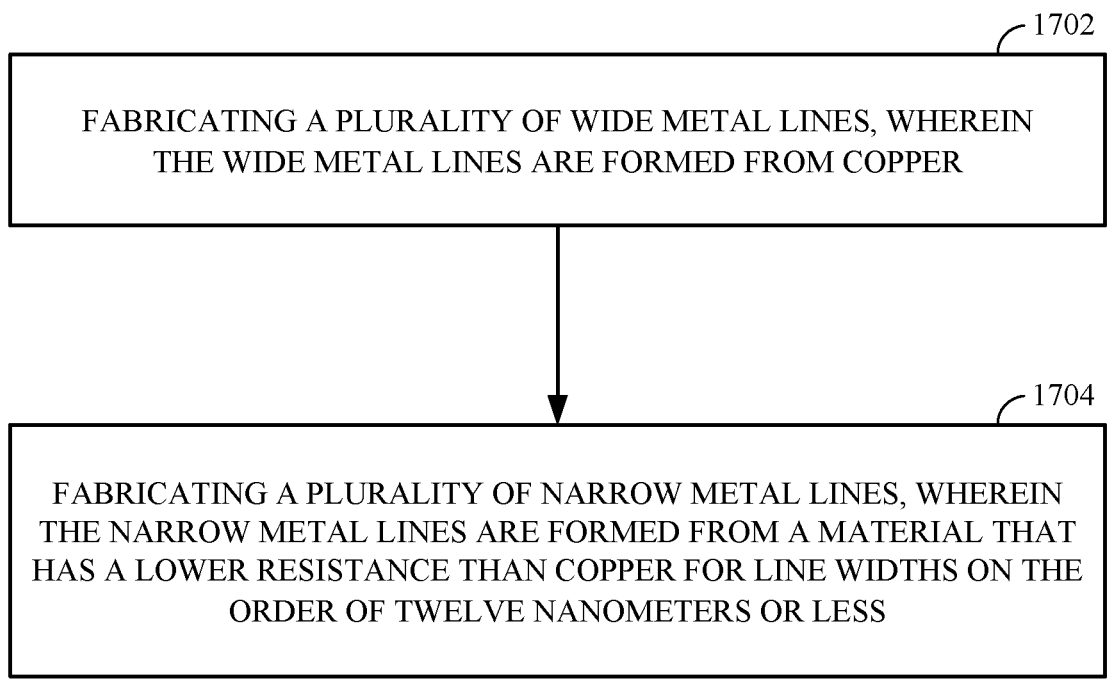
FIG. 17 is a flowchart illustrating aspects of methods according to aspects of the disclosure.

It will be appreciated from the foregoing that there are various methods for fabricating a standard cell according to aspects disclosed herein. FIG. 17 is a flowchart of a method for fabricating a standard cell in accordance with at least one aspect disclosed. For example, block 1702 includes fabricating a plurality of wide metal lines, wherein the wide metal lines are formed from copper. Block 1704 includes fabricating a plurality of narrow metal lines, wherein the narrow metal lines are formed from a material that has a lower resistance than copper for line widths on the order of twelve nanometers or less. Various processes for fabricating the wide metal lines and narrow metal lines were discussed in detail in the foregoing disclosure including the narrow metal lines being formed by subtractive etching and the wide metal lines being formed by a damascene process. It will be appreciated from the foregoing disclosure that additional processes for fabricating the various aspects disclosed herein will be apparent to those skilled in the art and a literal rendition of the process variations will not be provided or illustrated herein.

The foregoing disclosed devices, processes and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a semiconductor chip. The chips may then be employed in devices described above.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, embodiments disclosed herein can include a non-transitory computer-readable media embodying a method for fabricating standard cells as disclosed herein. Accordingly, the disclosure is not limited to illustrated examples as any means for performing the functionality described herein are contemplated by the present disclosure.

One or more of the components, processes, features, and/or functions illustrated in FIGS. 1-17 may be rearranged and/or combined into a single component, process, feature or function or incorporated in several components, processes, or functions. Additional elements, components, processes, and/or functions may also be added without departing from the disclosure. It should also be noted that FIGS. 1-17 and its corresponding description in the present disclosure is not limited to dies and/or ICs. In some implementations, FIGS. 1-17 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows various illustrative embodiments, it should be noted that various changes and modifications could be made herein without departing from the scope of the teachings of the present disclosure as defined by the appended claims. The functions, steps and/or actions of the method claims in accordance with the embodiments of the disclosure described herein need not be performed in any particular order. Furthermore, although elements of the present disclosure may be described or claimed in the singular, the plural is contemplated unless limitation to the singular is explicitly stated.

What is claimed is:

1. A standard cell comprising:
    a plurality of wide metal lines, wherein the wide metal lines are formed from copper; and
    a plurality of narrow metal lines, wherein the narrow metal lines are formed from a material that has a lower resistance than copper for line widths on an order of twelve nanometers or less,
    wherein the plurality of wide metal lines has a height that is greater than a height of the plurality of narrow metal lines.

2. The standard cell of claim 1, wherein the plurality of narrow metal lines is formed from at least one of rhodium (Rh), Platinum (Pt), iridium (Ir), Niobium (Nb), Nickel (Ni), Aluminum (Al), Ruthenium (Ru), Molybdenum (Mo) and Osmium (Os).

3. The standard cell of claim 1, wherein a ratio of a width of a wide metal line of the plurality of wide metal lines and a width of a narrow metal line of the plurality of narrow metal lines is on an order of three to one.

4. The standard cell of claim 1, wherein the plurality of wide metal lines each have a width of on an order of 35 nanometers.

5. The standard cell of claim 4, wherein the plurality of narrow metal lines each have a width of on an order of 12 nanometers.

6. The standard cell of claim 1, wherein the plurality of narrow metal lines each have a width of on an order of 12 nanometers.

7. The standard cell of claim 1, wherein the plurality of wide metal lines has the height that is at least five nanometers greater than the height of the plurality of narrow metal lines.

8. The standard cell of claim 1, further comprising:
    a plurality of barriers, wherein each barrier is formed around side surfaces and a bottom surface of each of the plurality of wide metal lines.

9. The standard cell of claim 8, wherein each barrier is formed of at least one of tantalum nitride (TaN) combinations including at least one of TaN/Ta, TaN/Co (cobalt) or TaN/Ru (Ruthenium).

10. The standard cell of claim 8, further comprising:
    a dielectric disposed between each of the plurality of narrow metal lines and the plurality of wide metal lines.

11. The standard cell of claim 10, wherein the dielectric is formed of a low dielectric constant material.

12. The standard cell of claim 11, wherein the low dielectric constant material is a carbon doped oxide dielectric.

13. The standard cell of claim 10, further comprising:
    an adhesion layer at one end of each of the plurality of narrow metal lines disposed between the plurality of wide metal lines.

14. The standard cell of claim 13, wherein the adhesion layer is titanium nitride (TiN).

15. The standard cell of claim 1, wherein the plurality of narrow metal lines are formed by a subtractive etching process.

16. The standard cell of claim 1, wherein the plurality of wide metal lines are formed by a damascene process.

17. The standard cell of claim 1, wherein the plurality of narrow metal lines are formed between at least two of the plurality of wide metal lines.

18. The standard cell of claim 17, wherein the at least two of the plurality of wide metal lines are configured to provide a supply voltage to a given circuit.

19. The standard cell of claim 18, wherein the plurality of the narrow metal lines are configured to conduct signals of the given circuit.

20. The standard cell of claim 1, wherein the standard cell is part of a semiconductor device incorporated into at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or a device in an automotive vehicle.

21. A method for fabricating a standard cell comprising:
fabricating a plurality of wide metal lines, wherein the wide metal lines are formed from copper; and
fabricating a plurality of narrow metal lines, wherein the narrow metal lines are formed from a material that has a lower resistance than copper for line widths on an order of twelve nanometers or less,
wherein the plurality of wide metal lines has a height that is greater than a height of the plurality of narrow metal lines.

22. The method of claim 21, wherein the plurality of narrow metal lines is formed from at least one of rhodium (Rh), Platinum (Pt), iridium (Ir), Niobium (Nb), Nickel (Ni), Aluminum (Al), Ruthenium (Ru), Molybdenum (Mo) and Osmium (Os).

23. The method of claim 21, wherein a ratio of a width of a wide metal line of the plurality of wide metal lines and a width of a narrow metal line of the plurality of narrow metal lines is on an order of three to one.

24. The method of claim 21, wherein the plurality of wide metal lines has the height that is at least five nanometers greater than the height of the plurality of narrow metal lines.

25. The method of claim 21, wherein the plurality of narrow metal lines are formed by subtractive etching and the plurality of wide metal lines are formed by a damascene process.

26. The method of claim 25, further comprising:
depositing an adhesion layer; and
depositing a narrow metal line material on the adhesive layer,
wherein fabricating the plurality of narrow metal lines includes patterning and etching the adhesion layer and narrow metal line material.

27. The method of claim 26, further comprising:
forming a dielectric substantially encapsulating each of the plurality of narrow metal lines; and
patterning and etching portions of the dielectric to form cavities for the plurality of wide metal lines.

28. The method of claim 27, further comprising:
forming a barrier over the dielectric including in the cavities for the plurality of wide metal lines.

29. The method of claim 28, further comprising:
depositing a copper layer over the barrier including filling the cavities,
wherein fabricating the plurality of wide metal lines includes using a chemical mechanical polishing/planarization to remove excess copper and barrier portions over the dielectric to form the plurality of wide metal lines from the filled cavities, and
wherein the barrier is formed around side surfaces and a bottom surface of each of the plurality of wide metal lines.

30. The method of claim 27, wherein the dielectric is formed of a low dielectric constant material.

* * * * *